United States Patent
Matsumoto

(10) Patent No.: US 9,129,915 B2
(45) Date of Patent: Sep. 8, 2015

(54) ORGANIC EL DISPLAY DEVICE AND METHOD OF MANUFACTURING THE SAME

(71) Applicant: Japan Display Inc., Tokyo (JP)

(72) Inventor: Yukio Matsumoto, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 0 days.

(21) Appl. No.: 14/321,919

(22) Filed: Jul. 2, 2014

(65) Prior Publication Data

US 2015/0008411 A1 Jan. 8, 2015

(30) Foreign Application Priority Data

Jul. 3, 2013 (JP) ................. 2013-139455

(51) Int. Cl.
| | |
|---|---|
| H01L 27/32 | (2006.01) |
| H01L 51/56 | (2006.01) |
| H05B 33/12 | (2006.01) |
| H01L 51/00 | (2006.01) |
| H01L 51/50 | (2006.01) |

(52) U.S. Cl.
CPC ........ *H01L 27/3211* (2013.01); *H01L 51/0027* (2013.01); *H01L 51/504* (2013.01); *H01L 51/56* (2013.01); *H01L 51/0055* (2013.01); *H01L 51/0059* (2013.01); *H01L 51/0069* (2013.01)

(58) Field of Classification Search
CPC .............................. H01L 51/52; H01L 51/56
USPC .......... 257/40, 52, 88, 89, 98, E51.021, 257/E51.022, E33.001; 313/501, 504; 438/29, 34, 35
See application file for complete search history.

(56) References Cited

U.S. PATENT DOCUMENTS

| | | | | |
|---|---|---|---|---|
| 8,288,784 | B2* | 10/2012 | Cho | 257/89 |
| 8,471,275 | B2* | 6/2013 | Lee et al. | 257/89 |
| 2004/0195963 | A1 | 10/2004 | Choi et al. | |
| 2005/0249972 | A1* | 11/2005 | Hatwar et al. | 428/690 |
| 2010/0123387 | A1* | 5/2010 | Lee et al. | 313/503 |
| 2014/0131674 | A1* | 5/2014 | Park et al. | 257/40 |

FOREIGN PATENT DOCUMENTS

JP 2004-311440 11/2004

* cited by examiner

*Primary Examiner* — Dao H Nguyen
(74) *Attorney, Agent, or Firm* — Lowe Hauptman & Ham, LLP

(57) ABSTRACT

Increase in resolution of an organic EL display panel is made achievable with a relatively simple process. An emissive layer of an OLED is formed by stacking an R emissive layer, a G emissive layer, and a B emissive layer corresponding to an R color, a G color, and a B color. The glass-transition temperatures $T_{g-R}$, $T_{g-G}$, and $T_{g-B}$ of the R emissive layer, the G emissive layer, and the B emissive layer are set to satisfy $T_{g-R} < T_{g-G} < T_{g-B}$. Due to laser irradiation, the G pixel is selectively annealed at an annealing temperature $T_A$ satisfying $T_{g-R} < T_A < T_{g-G}$ to make the R emissive layer of the G pixel lose an emission function. Further, the B pixel is selectively annealed at $T_A$ satisfying $T_{g-G} < T_A < T_{g-B}$ to make the R emissive layer and the G emissive layer of the B pixel lose the emission function.

7 Claims, 6 Drawing Sheets

ORGANIC EL DISPLAY DEVICE AND METHOD OF MANUFACTURING THE SAME

CROSS-REFERENCE TO RELATED APPLICATION

The present application claims priority from Japanese application JP2013-139455 filed on Jul. 3, 2013, the content of which is hereby incorporated by reference into this application.

BACKGROUND OF THE INVENTION

1. Field of the Invention

The present invention relates to an organic electroluminescence (EL) display device and a method of manufacturing the organic electroluminescence display device.

2. Description of the Prior Art(s)

The organic EL display device generates a plurality of colors such as red (R), green (G), and blue (B) using light emitted by organic light-emitting diodes (OLED) as organic electroluminescence elements to display a color image. Each of pixels arranged two-dimensionally in an image display area is constituted by a plurality of types of sub-pixels for emitting light different in color from one another. The emission intensities of the respective sub-pixels can independently be controlled, and the pixel can express a variety of colors in accordance with the balance between the emission intensities.

In the past, mechanisms of generating the plurality of colors have been roughly categorized into three configurations. The first configuration is one having a plurality of types of OLED having emission colors different from one another such as R, G, and B arranged in the image display area as sub-pixels. In the present configuration, the emission colors of the OLEDs are made different from one another by separately applying the materials of an emissive layer of the OLED in accordance with the colors of the sub-pixels. Therefore, the present configuration is called an RGB separate coating method or the like. In the RGB separate coating method, a shadow mask is disposed on a substrate, and the emissive layer is vapor-deposited in opening sections of the shadow mask.

The second configuration is one having an OLED for emitting white (W) light and a color filter (CF) combined with each other. In the present configuration, the OLEDs of the sub-pixels emit common white light, and color filters different in transmission color in accordance with the colors of the sub-pixels are disposed nearer to the display surface than the OLEDs. Hereinafter, the present configuration is called a CF method.

The third configuration is one called a color conversion materials (CCM) method. In the present configuration, an OLED for emitting blue (B) light is formed in each of the sub-pixels. In the B sub-pixel, the light emitted from the present OLED is emitted from the display surface. On the other hand, in the R sub-pixel and the G sub-pixel, the B light emitted from the OLED is converted into the R light and the G light, respectively, using color conversion layers.

SUMMARY OF THE INVENTION

The color filter absorbs a part of the transmitted light. Therefore, the CF method has a problem that the utilization efficiency of the light emitted by the OLED is decreased, and a problem that the life of the OLED is shortened if the drive current is increased to increase the emission intensity of the OLED.

The CCM method uses the OLED emitting the B light not only for the B sub-pixel but also for other sub-pixels, and is therefore easily affected by the property that the deterioration of the OLED emitting the B light is generally faster compared to the OLED emitting light with other colors. In other words, there is a problem that the life of a display panel is shortened. Further, there is a problem that the G, R sub-pixels are affected by the conversion efficiency in the color conversion layer, and are deceased in light emitting efficiency.

In contrast, the RGB separate coating method is favorable in the point of the light emitting efficiency and the life compared to the CF method and the CCM method. On the other hand, the RGB separate coating method requires a high-definition mask in accordance with the increase in resolution of the organic EL display device. Therefore, there is a problem that the increase in resolution of the organic EL display panel is limited by the shadow mask itself and the manufacturing process of the emissive layer using the shadow mask. Further, the manufacturing process using the shadow mask is required to prevent the accuracy of the mask from being deteriorated, and to prevent the structure on the substrate from being injured by the mask, and the technical difficulty exists in handling the mask, which makes it difficult to grow in size in particular of the display panel.

The present invention provides an organic EL display device and a method of manufacturing the organic EL display device making it achievable to increase in resolution of a display panel with a relatively simple process.

(1) An organic EL display device according to the invention is an organic EL display device including a plurality of types of organic electroluminescence elements each having an organic material layer which includes an emissive layer and is sandwiched between an anode and a cathode, and emitting light with emission colors different from one another, wherein the emissive layer of each of the organic electroluminescence elements is a laminated body obtained by stacking a plurality of specific color emissive layers provided corresponding to the emission colors, and an emission function of the specific color emissive layer corresponding to the emission color longer in wavelength than the emission color of the organic electroluminescence element is lost due to change of properties of a material in the specific color emissive layer.

(2) In the organic EL display device according to (1), it is possible to adopt a configuration in which the plurality of types of organic electroluminescence elements have the organic material layer deposited commonly to the organic electroluminescence elements.

(3) In the organic EL display device according to one of (1) and (2), it is possible to adopt a configuration in which the shorter the wavelength of the emission color of the specific color emissive layer is, the higher the glass-transition temperature of a host material of the specific color emissive layer is, and the change of properties of the material for making the specific color emissive layer lose the emission function is change of properties of the host material.

(4) A method of manufacturing an organic EL display device according to the invention is a method of manufacturing the organic EL display device according to (3), including the steps of: forming the laminated body of the emissive layer by sequentially stacking the specific color emissive layers corresponding to the emission colors above a substrate; and performing, after the step of forming, laser annealing on the emissive layer in each of shorter-wavelength organic electroluminescence elements having emission colors that are other than the emission color having the longest wavelength so as to heat the emissive layer to a temperature lower than the glass-transition temperature of the specific color emissive layer having the emission color of the shorter-wavelength organic electroluminescence element and higher than the glass-transition temperature of the specific color emissive layer having the emission color with the longest wavelength after that of the emission color of the shorter-wavelength organic electroluminescence element, thereby causing the change of properties of the host material in the specific color emissive layer having the emission color longer in wavelength than the emission color of the shorter-wavelength organic electroluminescence element.

DETAILED DESCRIPTION OF THE INVENTION

An embodiment of the invention (hereinafter referred to as an embodiment) will hereinafter be explained based on the accompanying drawings.

Figure 1:
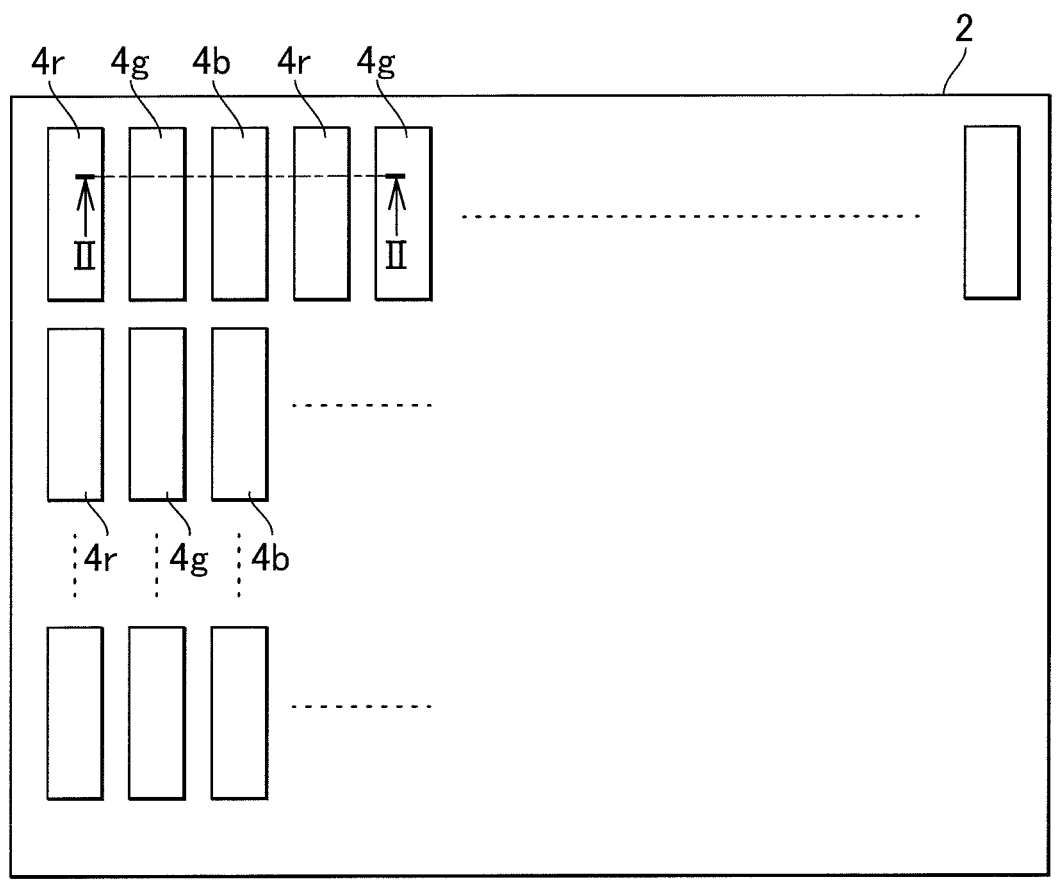
FIG. 1 is a schematic plan view of a display panel of an organic EL display device as an embodiment of the invention.

FIG. 1 is a schematic plan view of a display panel 2 of an organic EL display device as the embodiment of the invention. The display panel 2 according to the present embodiment displays a color image, and pixels in the color image are each composed of, for example, three types of sub-pixels for emitting light corresponding to R, G, and B. In the following explanation, the R, G, and B sub-pixels are expressed as R, G, and B pixels in order to simplify the description.

In the present embodiment, there is explained an example in which R pixels 4r, G pixels 4g, and B pixels 4b are arranged in a display area forming a stripe array. In the present arrangement, the pixels of the same type (color) are arranged in the vertical direction of the image, and the R, G, and B pixels are arranged periodically in the horizontal direction. It should be noted that in FIG. 1, the R pixels 4r, the G pixels 4g, and the B pixels 4b each schematically represent an effective light emitting area, and the area between these pixels corresponds to a bank.

Figure 2:
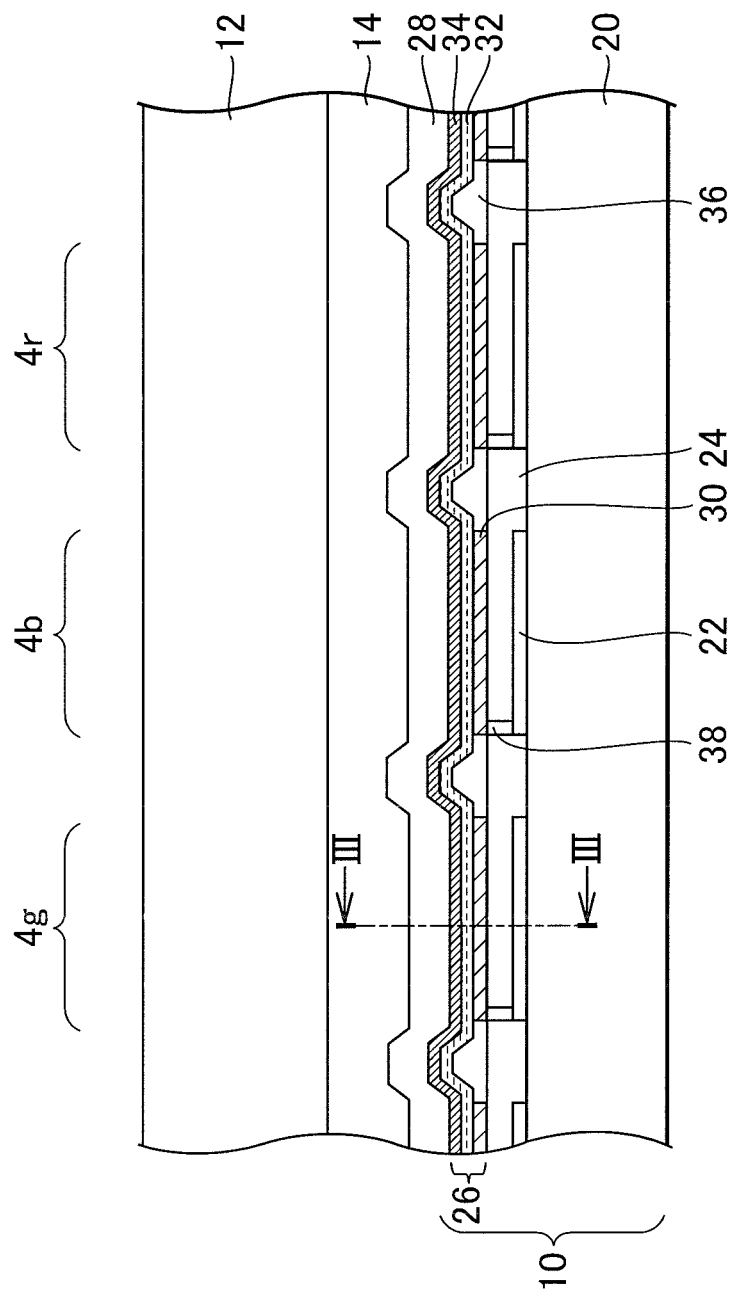
FIG. 2 is a schematic vertical cross-sectional view of the display panel at the position along the II-II line shown in FIG. 1.

FIG. 2 is a schematic vertical cross-sectional view of the display panel 2 at the position along the II-II line shown in FIG. 1. The display panel 2 has a structure having a TFT substrate 10 and an opposed substrate 12 bonded to each other with a filling material 14 sandwiched therebetween.

The TFT substrate 10 has a structure obtained by stacking a circuit portion 22, an insulating film 24, an OLED portion 26, a sealing film 28, and so on on a glass substrate 20.

The circuit portion 22 is an electronic circuit for supplying the OLED portion 26 with a current corresponding to a video signal to cause light emission. The circuit portion 22 is formed of a circuit element such as wiring lines and TFTs, and is formed on a surface of the glass substrate 20. For example, power supply lines and pixel circuits are formed in the display area. Further, outside the display area, there is formed a drive circuit for driving the display area, or there is connected a flexible board or the like connected to an external circuit.

The insulating film 24 is stacked on the surface of the glass substrate 20 so as to cover the circuit portion 22 to electrically insulate, for example, between the pixel circuits disposed pixel by pixel and between a lower electrode 30 and the circuit portion 22. The insulating film 24 is formed of, for example, silicon oxide ($SiO_2$) or silicon nitride (SiN).

The OLED portion 26 is configured including the lower electrode 30, an organic layer 32 (an organic material layer), an upper electrode 34, and a bank 36.

The lower electrode 30, the upper electrode 34 and the organic layer 32 sandwiched between these electrodes constitute the OLED. The upper electrode 34 is a common electrode commonly having contact with the organic layers 32 of basically all of the pixels in the display area. Meanwhile, the lower electrode 30 is formed separately for each of the pixels, and is electrically connected to the circuit portion 22 via a contact hole 38. In the present embodiment, the upper electrode 34 forms a cathode of the OLED, and the lower electrode 30 forms an anode. The upper electrode 34 and the lower electrode 30 are formed using a transparent electrically conductive material such as indium zinc oxide (IZO) or indium tin oxide (ITO). The organic layer 32 is provided with an emissive layer described later, and the emissive layer is injected with holes and electrons in accordance with a voltage applied to the both electrodes, and emits light due to recombination of the holes and the electrons.

The bank 36 is formed on the boundary between the R, G, and B pixels with the insulating layer, and electrically separates between the lower electrodes 30.

The sealing film 28 is stacked on the OLED portion 26. To deal with the deterioration of the characteristics of the OLED due to moisture, the sealing film 28 has a moisture-proof function for protecting the OLED from the moisture included in the filling material 14. For example, SiN can be used as the material of the sealing film 28.

The opposed substrate 12 is configured using a transparent glass substrate. The TFT substrate 10 and the opposed substrate 12 are disposed so as to be opposed to each other with a gap. A dam material (a seal material) (not shown) is disposed in the gap so as to surround the display area to seal the gap in the display area. The gap inside the dam material is filled with the filling material 14 (filler). The dam material and the filling material 14 cure to bond the both substrates to each other.

Figure 3:
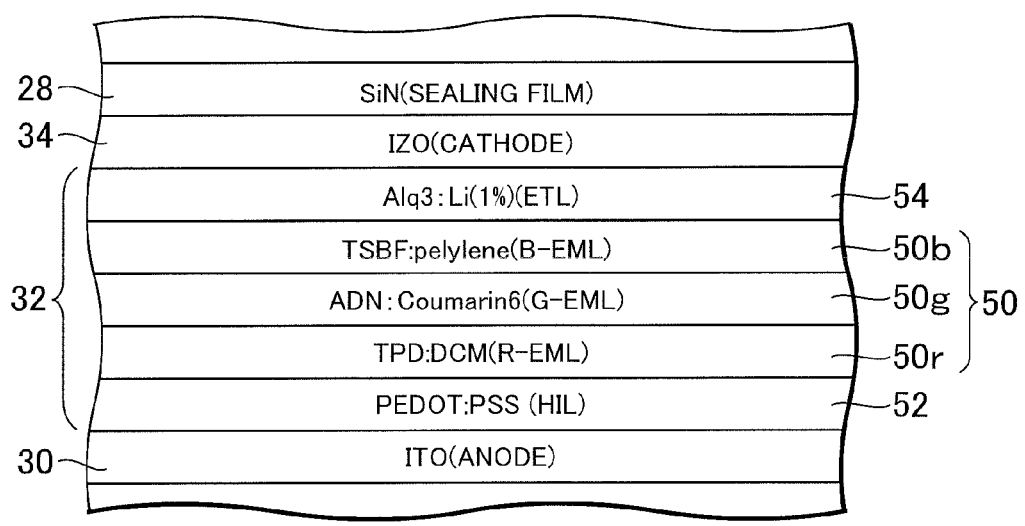
FIG. 3 is a schematic vertical cross-sectional view of an OLED along the III-III line shown in FIG. 2.

FIG. 3 is a schematic diagram showing a structure of the OLED in the display panel 2, and shows a vertical cross-sectional surface along the III-III line shown in FIG. 2. Although FIG. 3 shows a vertical cross-sectional surface in the G pixel, a common film continuous throughout entire pixels in the display area is deposited in the organic layer 32 as described later, and therefore, the types and sequence of the films stacked for forming the OLED are common to the R, G, and B pixels.

The layers constituting the organic layer 32 are sequentially stacked on the lower electrode 30. In the present embodiment, the organic layer 32 is provided with an emissive layer (EML) 50, a hole injection layer (HIL) 52, and an electron transport layer (ETL) 54. The hole injection layer 52, the emissive layer 50, and the electron transport layer 54 are sequentially stacked from the lower electrode 30 side. Then, the upper electrode 34 is stacked on the electron transport layer 54. Further, the emissive layer 50 is a laminated body of a plurality of specific color emissive layers disposed in accordance with the emission colors of the R, G, and B pixels, and there are sequentially stacked from the bottom, for example, an R emissive layer (R-EML) 50r for emitting the R light, a G emissive layer (G-EML) 50g for emitting the G light, and a B emissive layer (B-EML) 50b for emitting the B light. Each of the specific color emissive layers includes a host material and a dopant material dispersed in the host material.

As already described, the R emissive layer 50r, the G emissive layer 50g, and the B emissive layer 50b as the specific color emissive layers are deposited with the common material to the R, G, and B pixels. It should be noted that due to a treatment performed after the deposition, the specific color emissive layer corresponding to the emission color longer in wavelength than the emission color of the pixel is changed in the properties of the host material to lose its emission function. In the present embodiment, R has the longest wavelength among R, G and B, and the OLEDs of the G and B pixels are shorter-wavelength organic electroluminescence elements that have emission colors other than R. The disabled emissive layer is provided in the shorter-wavelength OLED. Specifically, the R emissive layer 50r loses the emission function in the G pixel, and the R emissive layer 50r and the G emissive layer 50g lose the emission function in the B pixel.

In the emissive layer, the electrons and the holes as carriers are transported by molecules of the host material, and then recombined with each other. Due to the recombination between the electrons and the holes, the molecules of the host material become in an excited state, then the energy is transferred to dopant molecules, and then the dopant molecules emit light. The specific color emissive layers having been changed in the properties of the host material in the G pixel and the B pixel are inhibited in such an emission mechanism, and thus become unable, or difficult to emit light. It should be noted that the specific color emissive layer having been changed in the properties of the host material still has a function of transmitting the carriers.

When the current is supplied to the emissive layer 50, the dopant molecules having lower excitation energy level preferentially emits light. In other words, among the plurality of specific color emissive layers constituting the emissive layer 50, one longer in wavelength of the emission color preferentially emits light. Therefore, in the emissive layer 50 of the R pixel, although all of the R emissive layer 50r, the G emissive layer 50g, and the B emissive layer 50b have the emission function, the emission of the R emissive layer 50r becomes dominant, and thus, the R light is emitted from the R pixel. In contrast, in the emissive layer 50 of the G pixel, since the R emissive layer 50r has lost the emission function, emission of the G emissive layer 50g becomes dominant among the G emissive layer 50g and the B emissive layer 50b having the emission function, and thus, the G light is emitted from the G pixel. Further, in the emissive layer 50 of the B pixel, since the R emissive layer 50r and the G emissive layer 50g have lost the emission function, the B emissive layer 50b emits light, and thus, the B light is emitted from the B pixel.

Here, the emissive layer is formed as an amorphous thin film from the viewpoint of ensuring the stability of the element operation. This is because if a crystalline thin film is used as the emissive layer, the film quality is apt to be uneven and nondense, and a probability of, for example, short circuit increases. Therefore, the change of properties of the host material in the emissive layer described above can be caused by rise in temperature. When heating the emissive layer to a temperature higher than the glass-transition temperature, the crystallization of the host material becomes possible, and thus the change of properties described above can be caused.

In the present embodiment, the host material of each of the R emissive layer 50r, the G emissive layer 50g, and the B emissive layer 50b is selected so that the shorter the wavelength of the emission color of the specific color emissive layer is, the higher the glass-transition temperature of the specific color emissive layer is. In other words, if a glass-transition temperatures $T_g$ of the host materials of the R emissive layer 50r, the G emissive layer 50g, and the B emissive layer 50b are denoted with $T_{g-R}$, $T_{g-G}$, and $T_{g-B}$, respectively, the following formula is fulfilled.

$$T_{g-R} < T_{g-G} < T_{g-B} \qquad (1)$$

Heating of the emissive layer 50 can locally be performed using laser annealing. In other words, by using a laser beam, the annealing treatment can be performed pixel by pixel. Further, by scanning the display area with the laser beam, the annealing treatment throughout the entire display area can be achieved.

In the present embodiment, the laser annealing treatment is performed on the G pixels and the B pixels. On this occasion, an annealing temperature $T_A$ with respect to the G pixels is controlled so as to satisfy the following formula using a method of, for example, controlling the output energy of the laser.

$$T_{g-R} < T_A < T_{g-G} \qquad (2)$$

Further, the annealing temperature TA with respect to the B pixels is controlled so as to satisfy the following formula.

$$T_{g-G} < T_A < T_{g-B} \qquad (3)$$

Figure 4:
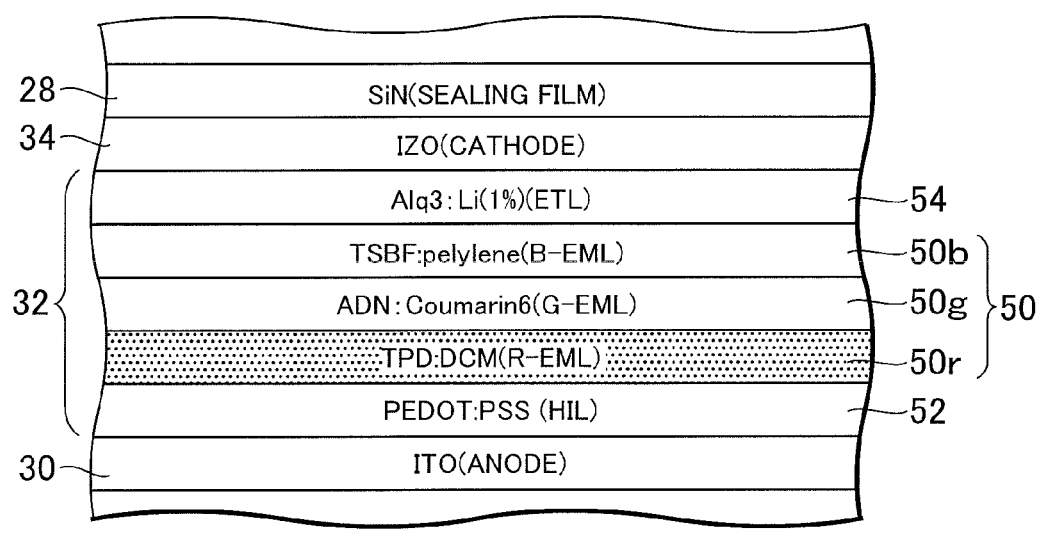
FIG. 4 is a schematic vertical cross-sectional view of the OLED of an R pixel on which a laser annealing treatment has been performed.
Figure 5:
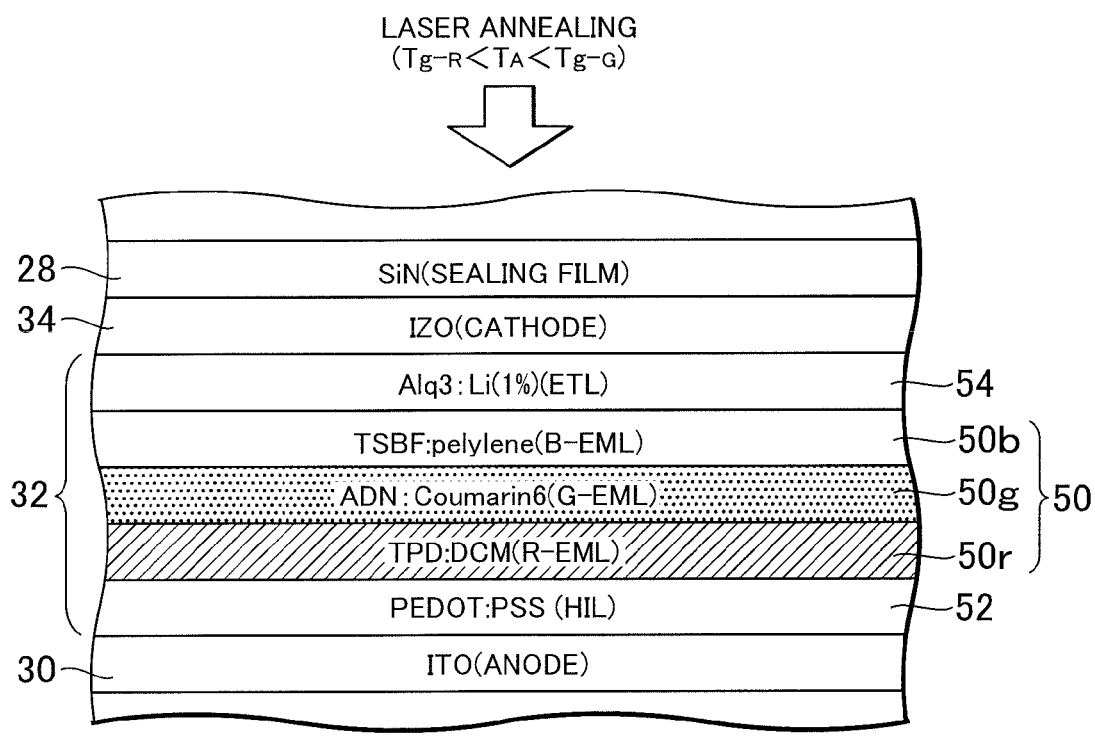
FIG. 5 is a schematic vertical cross-sectional view of the OLED of a G pixel on which the laser annealing treatment has been performed.
Figure 6:
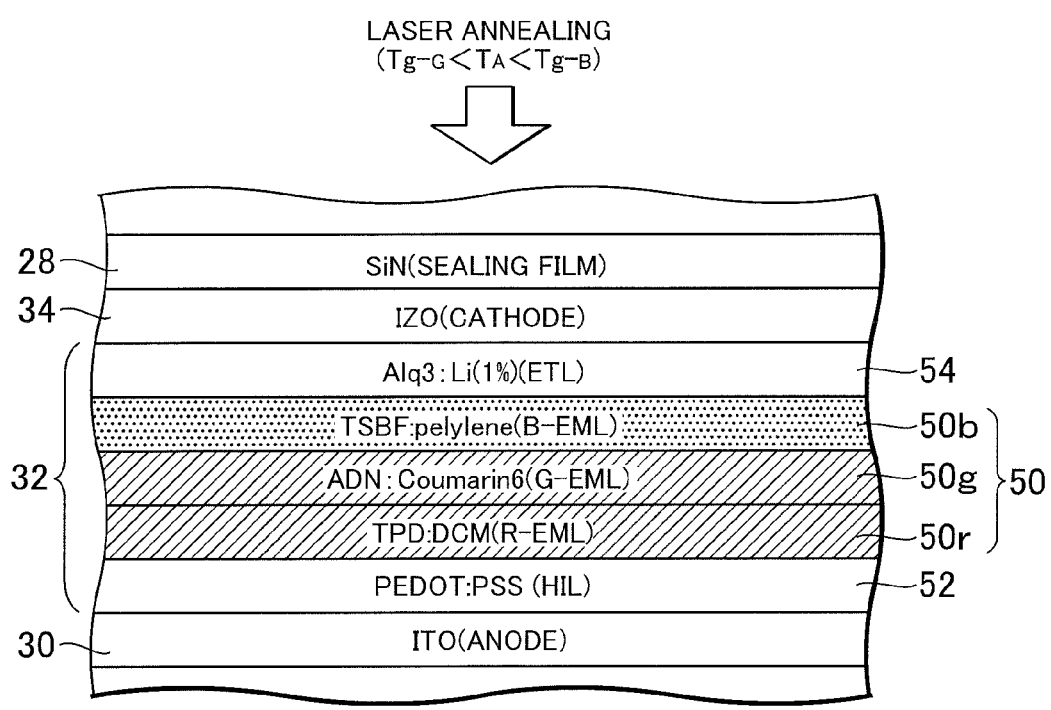
FIG. 6 is a schematic vertical cross-sectional view of the OLED of a B pixel on which the laser annealing treatment has been performed.

Thus, in the G pixels, only the emission function of the R emissive layer 50r among the three specific color emissive layers constituting the emissive layer 50 is lost, and the emission function of the G emissive layer 50g is maintained, and in the B pixels, the emission function of the R emissive layer 50r and the G emissive layer 50g is lost, and the emission function of the B emissive layer 50b is maintained. Further, in the R pixels where the laser annealing treatment is not performed, neither of the specific color emissive layers is altered, and the emission function of the R emissive layer 50r is maintained. FIGS. 4 through 6 are vertical cross-sectional views of the OLED schematically showing the above process, wherein FIG. 4 shows the OLED in the R pixels, FIG. 5 shows the OLED in the G pixels, and FIG. 6 shows the OLED in the B pixels, the specific color emissive layer having lost the emission function due to the laser annealing treatment is indicated by hatching with oblique lines, and the specific color emissive layer emitting light due to the current supply is indicated by hatching with a mesh.

It should be noted that the dopant material of each of the specific color emissive layer changes its properties by being heated, which can also make the specific color emissive layer lose the emission function. Here, alteration temperatures of the dopant materials of the R emissive layer 50r, the G emissive layer 50g, and the B emissive layer 50b are denoted with $T_{d-R}$, $T_{d-G}$, and $T_{d-B}$, respectively. Taking the loss of the emission function due to the dopant material into consideration, the host material and the dopant material of each of the specific color emissive layers are selected so as to satisfy the following formula instead of Formula 1.

$$\min\{T_{g-R}, T_{d-R}\} < \min\{T_{g-G}, T_{d-G}\} < \min\{T_{g-B}, T_{d-B}\} \qquad (4)$$

Further, the annealing temperatures $T_A$ with respect to the G pixels and the B pixels are controlled so as to satisfy Formulas 5 and 6 below instead of Formulas 2 and 3, respectively.

$$\min\{T_{g\text{-}R}, T_{d\text{-}R}\} < T_A < \min\{T_{g\text{-}G}, T_{d\text{-}G}\} \quad (5)$$

$$\min\{T_{g\text{-}G}, T_{d\text{-}G}\} < T_A < \min\{T_{g\text{-}B}, T_{d\text{-}B}\} \quad (6)$$

As described above, due to the configuration of the specific color emissive layers and the laser annealing treatment, it becomes possible to form the R, G, and B pixels with high resolution. Further, since the method of forming the OLED described above does not need to use the high-definition mask for applying the emissive layer separately by the R, G, and B pixels, it is possible to eliminate the defect factors caused by the process such as a foreign matter or a damage in the separate coating method described in the description of the related art, and thus, the organic EL display panel can be manufactured at a high yield ratio and a low cost.

The laser annealing treatment can be performed after forming the OLED portion 26. In order to maintain the laminated structure of the OLED having already been formed at the moment of the annealing treatment, it is preferable to select the materials of the respective layers so that the layers constituting the OLED are not melted by the annealing treatment.

Hereinafter, the layers constituting the organic layer 32 according to the present embodiment will be explained.

The R emissive layer 50r is formed using TPD (N,N'-Bis(3-methylphenyl)-N,N'-bis(phenyl)-benzidine) as the host material, and DCM ((E)-2-(2-(4-(dimethylamino)styryl)-6-methyl-4H-pyran-4-ylidene)malononitrile) as the dopant material. For example, it is possible to set the film thickness to 20 nm, and the dopant concentration to 3%.

The G emissive layer 50g is formed using, for example, ADN (9,10-Di(naphth-2-yl)anthracene) as the host material, and Coumarin 6 (3-(2-Benzothiazolyl)-7-(diethylamino)coumarin) as the dopant material. For example, it is possible to set the film thickness to 20 nm, and the dopant concentration to 5%.

The B emissive layer 50b is formed using, for example, TSBF (2,7-Bis(9,9-spirobifluoren-2-yl)-9,9-spirobifluorene) as the host material, and Perylene as the dopant material. For example, it is possible to set the film thickness to 20 nm, and the dopant concentration to 5%.

Incidentally, the glass-transition temperatures of the host materials of these specific color emissive layers ascend in the order of TPD, ADN, and TSBF to satisfy the relationship of "$T_{g\text{-}R} < T_{g\text{-}G} < T_{g\text{-}B}$" in Formula 1 described above. It should be noted that the materials of these specific color emissive layers are illustrative only, and other materials satisfying Formula 1 or 4 can be adopted as the host materials and the dopant materials. Further, the dopant materials are not limited to fluorescent materials, but can also be phosphorescent materials. The deposited film thickness and the dopant concentration described above are also illustrative only, and can arbitrarily be changed.

The hole injection layer 52 can be formed using, for example, (Poly(3,4-ethylenedioxythiophene)-poly(styrenesulfonate)) to have a film thickness of 60 nm. It should be noted that the hole injection layer 52 can be formed of other organic materials, and can be formed using, for example, CuPc (Copper phthalocyanine) or HAT-CN6 (hexaazatirphenylene hexacarbonitrile).

The electron transport layer 54 is formed of a film obtained by co-evaporation of Alq3 (Tris(8-quinolinolato)aluminum) and lithium (Li), and the concentration of Li is set to 1 wt %, and the film thickness is set to 30 nm.

The display panel 2 having the structure described above is manufactured by bonding the opposed substrate 12 to the TFT substrate 10 provided with the OLED and so on. The TFT substrate 10 can be manufactured through such processes as described below. The circuit portion 22 is formed on one principal surface of the glass substrate 20 using a photolithography process, and the insulating film 24 formed of $SiO_2$, SiN, or the like is deposited thereon using a chemical vapor deposition (CVD) process or the like. After providing the contact holes 38 to the insulating film 24, a conductive film is deposited on the insulating film 24, then patterned using a photolithography process to thereby form the lower electrodes 30. The lower electrode 30 fills the contact hole 38, and is electrically connected to the TFT constituting the circuit portion 22. For example, the lower electrode 30 is formed of ITO, and can be deposited using a reactive sputtering process using an $Ar+O_2$ mixed gas. It should be noted that in the case of adopting a top emission system as the display panel 2, it is possible to provide the lower electrode 30 with a double-layered structure obtained by stacking a transparent conductive film on a reflecting layer formed of a material high in optical reflectance. For example, the reflecting layer can be formed of aluminum (Al) or silver (Ag).

After forming the lower electrodes 30, photosensitive acrylic resin, for example, is applied on the lower electrodes 30, and then patterned using a photolithography process to thereby form the bank 36 in the pixel boundaries. The lower electrode 30 is exposed in the effective area of the pixel surrounded by the bank 36.

The hole injection layer 52 is selectively stacked on the lower electrode 30 using, for example, a coating method such as an inkjet method.

Subsequently, the R emissive layers 50r, the G emissive layers 50g, the B emissive layers 50b, and the electron transport layers 54 are sequentially deposited by a mask vapor deposition method using a shadow mask having openings corresponding to the respective display areas. On this occasion, the co-evaporation of the host material and the dopant material is performed on each of the specific color emissive layers. It should be noted that the deposition process using the present evaporation can be performed using an evaporation boat made of molybdenum (Mo) in an evaporation chamber capable of setting the atmospheric pressure to be equal to or lower than $1.0 \times 10^{-4}$ Pa.

The organic layer 32 is stacked in the process described hereinabove, and IZO, for example, is deposited thereon as the upper electrode 34 by the reactive sputtering method using the $Ar+O_2$ mixed gas. The film thickness can be set to, for example, 100 nm. Further, SiN is deposited as the sealing film 28 using a CVD method. The SiN film can be formed by using $SiH_4$, $NH_3$, and $N_2$ as a mixed gas, and generating plasma. For example, the SiN film thickness can be set to 500 μm. Further, it is preferable that the rise in temperature of the substrate is as small as possible in the present deposition process, and the present deposition process is performed at the temperature, for example, equal to or lower than 50° C.

The TFT substrate 10 is manufactured in such a manner as described above, and then the TFT substrate 10 and the opposed substrate 12 are bonded to each other. For example, the dam material is disposed on the TFT substrate 10 side so as to surround the display area, then the filling material 14 is dropped inside the dam material using a dispenser, and then, the TFT substrate 10 and the opposed substrate 12 are bonded to each other. The filling material 14 is formed of epoxy resin or acrylic resin, and cures with heat or the like to bond the TFT substrate 10 and the opposed substrate 12 to each other.

The panel manufactured in such a manner as described above is cut by a glass cutter or the like, and thus, the display panel 2 on which the annealing treatment has not been performed is completed.

The laser annealing treatment is performed on the display panel 2. For example, in the display panel 2 according to the present embodiment provided with the emissive layer 50 including the material described above, 100° C. can be selected as the annealing temperature $T_A$ satisfying Formulas 2 and 5, and 150° C. can be selected as the annealing temperature $T_A$ satisfying Formulas 3 and 6. Therefore, the light emitting area of the G pixel is irradiated with an excimer laser adjusted so that $T_A$ becomes 100° C., and the light emitting area of the B pixel is irradiated with an excimer laser adjusted so that $T_A$ becomes 150° C., respectively, for one minute, for example. Here, the temperature adjustment can be performed by adjusting the laser output or the duty cycle of the laser pulse.

The chromatic variation before and after the laser irradiation will be shown in the following table.

TABLE 1

|  | BEFORE LASER IRRADIATION | AFTER LASER IRRADIATION |
| --- | --- | --- |
| R PIXEL | 0.58, 0.39 | — |
| G PIXEL | 0.58, 0.39 | 0.33, 0.57 |
| B PIXEL | 0.58, 0.39 | 0.14, 0.18 |

This table shows the coordinate (x, y) on the x-y chromaticity diagram of the emission color before the laser irradiation, and the coordinate (x, y) on the x-y chromaticity diagram of the emission color after the laser irradiation for each of the R, G, and B pixels. Orangey red emission represented by the coordinate values of (0.58, 0.39) can be obtained before the laser irradiation in either of the R, G, and B pixels. In contrast, after the laser irradiation, the G pixel emits yellowish green light represented by the coordinate values of (0.33, 0.57), and the B pixel emits blue (indigo blue) light represented by the coordinate values of (0.14, 0.18). It should be noted that also after the laser annealing treatment of the G pixel and the B pixel, the R pixel emits light with the same color as before that process. As described above, by performing the laser annealing treatment, the change in emission color in the emissive layer 50 can be caused, and thus, there can be obtained the display panel 2 for performing the color display using the emission of the R, G, and B pixels different in color from one another.

The invention is not limited to the embodiment described above, but can variously be modified within the scope or the spirit of the invention.

For example, the organic layer 32 can also be provided with a hole transport layer disposed between the hole injection layer 52 and the emissive layer 50, or can also be provided with an electron injection layer disposed between the electron transport layer 54 and the upper electrode 34 (the cathode). Further, there is no problem if a carrier block layer or the like is provided. Further, between the electron transport layer 54 and the cathode, there is no problem if a layer using Liq ((8-hydroxyquinolinolato)-lithium), $LiO_2$, or LiF besides Li is formed, or Liq mixed deposition with the electron transport material is formed.

Further, each of the layers of the organic layer 32 can be formed using methods other than those described above, and a coating method such as a spin coat method or the inkjet method, or the deposition method such as organic deposition, sputtering, or chemical vapor deposition (CVD) method can arbitrarily be selected.

In the laser annealing treatment, there is no problem if a laser other than the excimer laser such as a YAG laser is used.

The invention can be applied not only to the display panel 2 of the top-emission type, but also to a display panel of a bottom emission type. In either of the types, the electrode located on the opposite side to the display screen among the cathode and the anode of the OLED can be formed of a material such as Al or Mg—Ag without using the transparent conductive material.

It should be noted that although in the embodiment described above, the laser irradiation is performed after bonding the TFT substrate 10 and the opposed substrate 12 to each other, the laser irradiation can also be performed before the bonding. In particular, the annealing treatment using the laser irradiation can also be performed in the halfway stage of stacking of the emissive layer 50. Specifically, the laser irradiation is performed on both of the G pixel and the B pixel to perform the annealing at the temperature higher than $T_{g-R}$ or $\min\{T_{g-R}, T_{d-R}\}$ in the stage of stacking the R emissive layer 50r on the lower electrode 30 as the emissive layer 50, and then the G emissive layer 50g is stacked, and the laser irradiation is performed only on the B pixel to perform the annealing at the temperature higher than $T_{g-G}$ or $\min\{T_{g-G}, T_{d-G}\}$, and then the B emissive layer 50b is stacked, and thus, the emissive layer 50 for emitting the light with the color different between the R, G, and B pixels can be completed. On this occasion, the magnitude relation between the glass-transition temperatures of the respective specific color emissive layers becomes basically arbitrary, and the flexibility of the stacking sequence of the specific color emissive layers increases accordingly. Further, in the case in which $T_{g-G}$ or $\min\{T_{g-G}, T_{d-G}\}$ is higher than $T_{g-R}$ or $\min\{T_{g-R}, T_{d-R}\}$, by performing the laser irradiation only on the G pixel and omitting the laser irradiation on the B pixel in the stage in which the R emissive layer 50r has been stacked, and then performing the laser irradiation on the B pixel in the stage in which the G emissive layer 50g has been stacked to perform the annealing at the temperature higher than $T_{g-G}$ or $\min\{T_{g-G}, T_{d-G}\}$, it is possible to make the R emissive layer 50r lose the emission function together with the G emissive layer 50g.

In the embodiment described above, by depositing the specific color emissive layers commonly to all of the pixels in the display area, the high-definition shadow mask can be made unnecessary. In contrast, in the structure of forming the emissive layer 50 having the specific color emissive layers stacked pixel by pixel, it is also possible to make the specific color emissive layer selectively lose the emission function pixel by pixel using the laser annealing described above to form a plurality of types of pixels different in emission color from one another.

As described hereinabove in the description of the embodiment, according to the invention, the increase in resolution of the display panel becomes achievable using a relatively simple process in the organic EL display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
a plurality of organic electroluminescence elements each having an organic material layer which includes an emissive layer and is sandwiched between an anode and a cathode, and emitting light with emission colors different from one another,
wherein the emissive layer of each of the organic electroluminescence elements is a laminated body obtained by stacking a plurality of specific color emissive layers provided corresponding to the emission colors, and
a species of the plurality of specific color emissive layers of the laminated body and a stacking sequence of the plurality of specific color emissive layers of the laminated body is substantially the same in each organic electroluminescence elements.

2. The organic EL display device according to claim 1, wherein the plurality of organic electroluminescence elements have the organic material layer deposited commonly to the organic electroluminescence elements.

3. The organic EL display device according to claim 1, wherein the shorter the wavelength of the emission color of the specific color emissive layer is, the higher the glass-transition temperature of a host material of the specific color emissive layer is, and
the change of properties of the material for making the specific color emissive layer lose the emission function is change of properties of the host material.

4. A method of manufacturing an organic EL display device,
the organic EL device comprising:
a plurality of organic electroluminescence elements each having an organic material layer which includes an emissive layer and is sandwiched between an anode and a cathode, and emitting light with emission colors different from one another,
wherein the emissive layer of each of the organic electroluminescence elements is a laminated body obtained by stacking a plurality of specific color emissive layers provided corresponding to the emission colors,
and the method of manufacturing the organic EL display device comprising the steps of:
forming the laminated body of the emissive layer by sequentially stacking the specific color emissive layers corresponding to the emission colors above a substrate;
performing, after the step of forming, laser annealing on the emissive layer in each of shorter-wavelength organic electroluminescence elements having emission colors that are other than the emission color having the longest wavelength so as to heat the emissive layer to a temperature lower than a glass-transition temperature of the specific color emissive layer having the emission color of the shorter-wavelength organic electroluminescence element and higher than the glass-transition temperature of the specific color emissive layer having the emission color with the longest wavelength after that of the emission color of the shorter-wavelength organic electroluminescence element, thereby causing a change of properties of a host material in the specific color emissive layer having the emission color longer in wavelength than the emission color of the shorter-wavelength organic electroluminescence element, and
wherein the shorter the wavelength of the emission color of the specific color emissive layer, the higher the glass-transition temperature of the host material of the specific color emissive layer, and
a change of properties of a material for making the specific color emissive layer lose an emission function is the change of properties of the host material.

5. An organic EL display device comprising:
a plurality of organic electroluminescence elements each having an organic material layer which includes an emissive layer and is sandwiched between an anode and a cathode, and emitting light with emission colors different from one another,
wherein the emissive layer of each of the organic electroluminescence elements is a laminated body obtained by stacking a plurality of specific color emissive layers provided corresponding to the emission colors, and
a thickness of the laminated body which is sandwiched between an anode and a cathode is substantially equal in each organic electroluminescence elements.

6. The organic EL display device according to claim 5, wherein each of the plurality of organic electroluminescence elements has the organic material layer deposited commonly to the organic electroluminescence elements.

7. The organic EL display device according to claim 5, wherein the shorter the wavelength of the emission color of the specific color emissive layer, the higher the glass-transition temperature of a host material of the specific color emissive layer, and
a change of properties of the material for making the specific color emissive layer lose an emission function is a change of properties of the host material.

* * * * *